(12) United States Patent
Yun et al.

(10) Patent No.: US 12,248,683 B2
(45) Date of Patent: Mar. 11, 2025

(54) STORAGE DEVICE AND OPERATING METHOD OF CONTROLLER

(71) Applicant: SK hynix Inc., Gyeonggi-do (KR)

(72) Inventors: Sang Ho Yun, Gyeonggi-do (KR); Jang Seob Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 159 days.

(21) Appl. No.: 17/994,080

(22) Filed: Nov. 25, 2022

(65) Prior Publication Data

US 2023/0305715 A1 Sep. 28, 2023

(30) Foreign Application Priority Data

Nov. 25, 2021 (KR) .................. 10-2021-0164481
Oct. 7, 2022 (KR) .................. 10-2022-0128781

(51) Int. Cl.
*G11C 29/50* (2006.01)
*G06F 3/06* (2006.01)

(52) U.S. Cl.
CPC .......... *G06F 3/0619* (2013.01); *G06F 3/0653* (2013.01); *G06F 3/0679* (2013.01); *G11C 29/50004* (2013.01)

(58) Field of Classification Search
CPC .... G06F 3/0619; G06F 3/0653; G06F 3/0679; G06F 3/0625; G06F 3/0634; G06F 3/0659; G06F 3/0644; G06F 3/0604; G06F 3/061; G06F 3/0658; G11C 29/50004; G11C 11/5642; G11C 16/0483; G11C 2029/0409; G11C 16/26; G11C 16/349; G11C 29/021; G11C 29/028; G11C 16/08; G11C 16/24; G11C 16/34

USPC .................................. 365/189.09, 185.24
See application file for complete search history.

(56) References Cited

U.S. PATENT DOCUMENTS

| | | | | |
|---|---|---|---|---|
| 2007/0279989 A1* | 12/2007 | Aritome | ............. | G11C 16/3427 |
| | | | | 365/185.18 |
| 2009/0154237 A1* | 6/2009 | Tokiwa | .................. | G11C 16/20 |
| | | | | 365/185.11 |
| 2009/0175076 A1* | 7/2009 | Cho | ...................... | G11C 16/349 |
| | | | | 365/189.011 |
| 2009/0190397 A1* | 7/2009 | Cho | ..................... | G11C 11/5642 |
| | | | | 365/185.18 |
| 2013/0070526 A1* | 3/2013 | Eun | ..................... | G11C 16/3436 |
| | | | | 365/185.18 |
| 2015/0179284 A1* | 6/2015 | Alrod | .................... | G06F 11/076 |
| | | | | 714/704 |

(Continued)

FOREIGN PATENT DOCUMENTS

| CN | 112242171 A | * | 1/2021 | ....... | G01R 19/16566 |
| CN | 110265083 B | * | 7/2021 | ............. | G11C 29/08 |

(Continued)

*Primary Examiner* — Michael T Tran
(74) *Attorney, Agent, or Firm* — IP & T GROUP LLP

(57) ABSTRACT

A storage device includes a memory device and a controller. The memory device includes a memory region which includes a first sub-region and a second sub-region. The controller reads assist data from a plurality of memory cells according to an assist read voltage during a read voltage adjusting operation on the first sub-region as a target sub-region, and re-utilizes the read assist data during the read voltage adjusting operation on the second sub-region as the target sub-region.

18 Claims, 11 Drawing Sheets

(56) References Cited

U.S. PATENT DOCUMENTS

| | | | | |
|---|---|---|---|---|
| 2016/0005480 | A1* | 1/2016 | Kim | G11C 29/021 |
| | | | | 365/185.11 |
| 2016/0132256 | A1* | 5/2016 | Jung | G06F 12/0246 |
| | | | | 711/103 |
| 2018/0189135 | A1* | 7/2018 | Naik | G11C 29/028 |
| 2020/0401850 | A1* | 12/2020 | Bazarsky | G06V 10/774 |
| 2021/0035648 | A1* | 2/2021 | Tao | G11C 29/028 |
| 2021/0065828 | A1* | 3/2021 | Yu | G11C 11/5628 |
| 2021/0089391 | A1* | 3/2021 | Kuribara | H03M 13/1515 |
| 2021/0090682 | A1* | 3/2021 | Tokutomi | G11C 11/5642 |
| 2021/0118510 | A1* | 4/2021 | Doller | G11C 16/12 |
| 2021/0124529 | A1* | 4/2021 | Nishikawa | G06F 3/0659 |
| 2021/0125045 | A1* | 4/2021 | Jang | G06N 3/049 |
| 2021/0159252 | A1* | 5/2021 | Okamoto | H04N 25/771 |
| 2021/0240632 | A1* | 8/2021 | Jeon | G06F 12/10 |
| 2021/0272634 | A1* | 9/2021 | Shirota | G11C 16/08 |

FOREIGN PATENT DOCUMENTS

| | | |
|---|---|---|
| KR | 10-2017-0086173 A | 7/2017 |
| KR | 10-2020-0130008 A | 11/2020 |

* cited by examiner

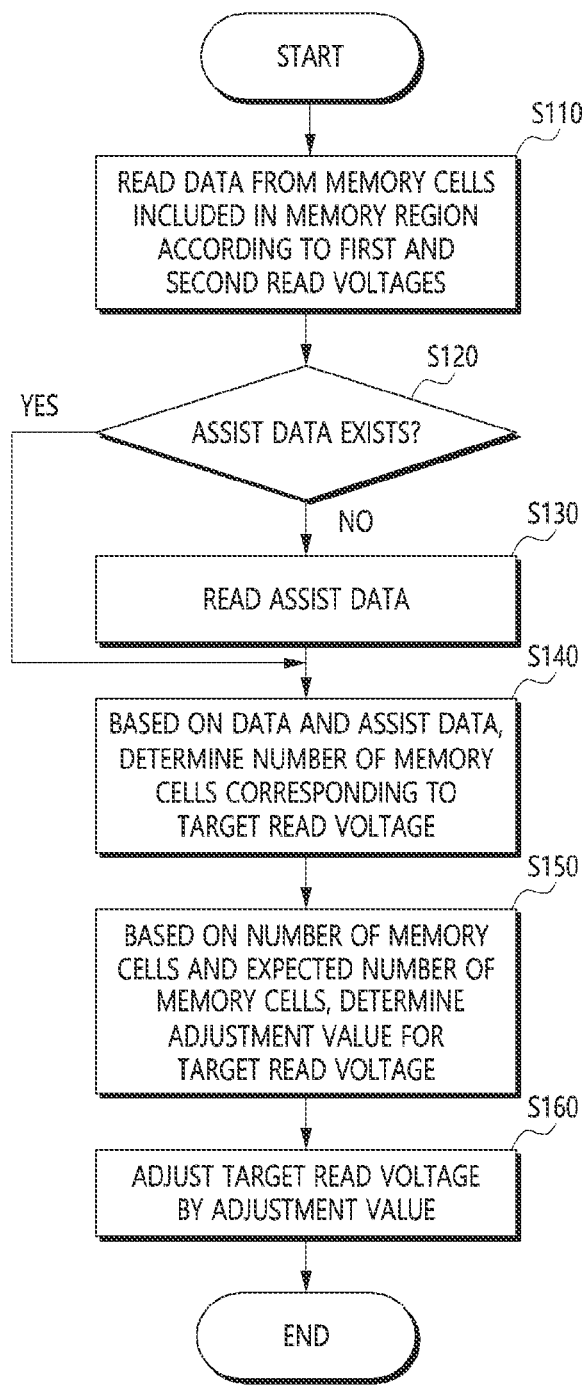

STORAGE DEVICE AND OPERATING METHOD OF CONTROLLER

CROSS-REFERENCES TO RELATED APPLICATION

The present application claims priority under 35 U.S.C. § 119(a) to Korean application number 10-2021-0164481, filed on Nov. 25, 2021, and Korean application number 10-2022-0128781, filed on Oct. 7, 2022, which are incorporated herein by reference in their entirety as set forth in full.

BACKGROUND

1. Technical Field

Various embodiments of the present disclosure are related to a storage device including a memory device.

2. Related Art

A storage device may store data provided from an external device in response to a write request from the external device. Furthermore, the storage device may provide stored data to the external device in response to a read request from the external device. The external device is an electronic device capable of processing data and may include a computer, a digital camera, a mobile phone and so forth. The storage device may be mounted in the external device or may be fabricated to be capable of being connected to and detached from the external device. The storage device may include a memory device and a controller configured to control the memory device.

The memory device may include a plurality of memory cells each configured to store data therein. Various operation strategies of the controller are proposed in order to promptly and stably obtain data stored in the memory cells even when a status of the memory cell changes.

SUMMARY

In an embodiment of the present disclosure, a storage device may include a memory device and a controller. The memory device may include a memory region which includes a first sub-region and a second sub-region. The controller may read assist data from a plurality of memory cells according to an assist read voltage during a read voltage adjusting operation on the first sub-region as a target sub-region, and to re-utilize the read assist data during the read voltage adjusting operation on the second sub-region as the target sub-region.

In an embodiment of the present disclosure, a storage device may include a memory device and a controller. The memory device may include a plurality of memory cells. The controller may determine a number of errors corresponding to a target read voltage among a plurality of read voltages, determine, based on an expected threshold voltage distribution, a first threshold voltage corresponding to the number of errors, determine, based on the expected threshold voltage distribution, a second threshold voltage corresponding to an adjusted number of errors that is equal to or less than a number of errors that can be corrected through an error correcting operation, and determine, as an adjustment value for the target read voltage, a difference between the first threshold voltage and the second threshold voltage.

In an embodiment of the present disclosure, an operating method of a controller included in a storage device may include reading data from a plurality of memory cells according to a first read voltage and a second read voltage having a higher level than the first read voltage; reading assist data from the plurality of memory cells according to an assist read voltage having a level between the first read voltage and the second read voltage; determining, based on the data and the assist data, a number of memory cells corresponding to a target read voltage selected from the first read voltage and the second read voltage; and determining, based on the number of memory cells and an expected number of memory cells, an adjustment value for the target read voltage.

In an embodiment of the present disclosure, an operating method of a controller may include consecutively performing first and second adjusting operations respectively on first and second regions commonly with reference data. The first adjusting operation may include obtaining numbers of first and second target memory cells by reading first and second data and the reference data respectively according to first and second read voltages and a reference read voltage, the first and second target memory cells respectively corresponding to the first and second read voltages and the reference read voltage being between the first and second read voltages; obtaining numbers of first and second deviant memory cells respectively based on the numbers of first and second target memory cells and predetermined first and second numbers respectively corresponding to the first and second read voltages; obtaining first and second adjustment amounts based on the numbers of first and second deviant memory cells and an accumulated number of memory cells, the accumulated number being predetermined and depending on threshold voltages of the memory cells; and adjusting the first and second read voltages respectively by the first and second adjustment amounts. The second adjusting operations may be performed in the same manner as the first adjusting operation except that the numbers of first and second target memory cells are obtained by the already-read reference data without repeatedly reading the reference data.

BRIEF DESCRIPTION OF THE DRAWINGS

FIG. 10 is a flowchart illustrating a read voltage adjusting operation of a controller of FIG. 1 in accordance with an embodiment of the present disclosure.

DETAILED DESCRIPTION

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The drawings are not necessarily to scale and, in some instances, proportions may have been exaggerated in order to clearly illustrate features of the embodiments. The terminology used herein is for the purpose of describing particular embodiments only and is not intended to be limiting of the disclosure.

As used herein, the term "and/or" includes at least one of the associated listed items. It will be understood that when an element is referred to as being "connected to", or "coupled to" another element, it may be directly, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, various embodiments of the present disclosure will be described below with reference to the accompanying drawings.

In accordance with an embodiment, provided may be a storage device and an operating method of a controller capable of effectively performing a read voltage adjusting operation thereby promptly and stably obtaining data stored in a memory device.

Figure 1:
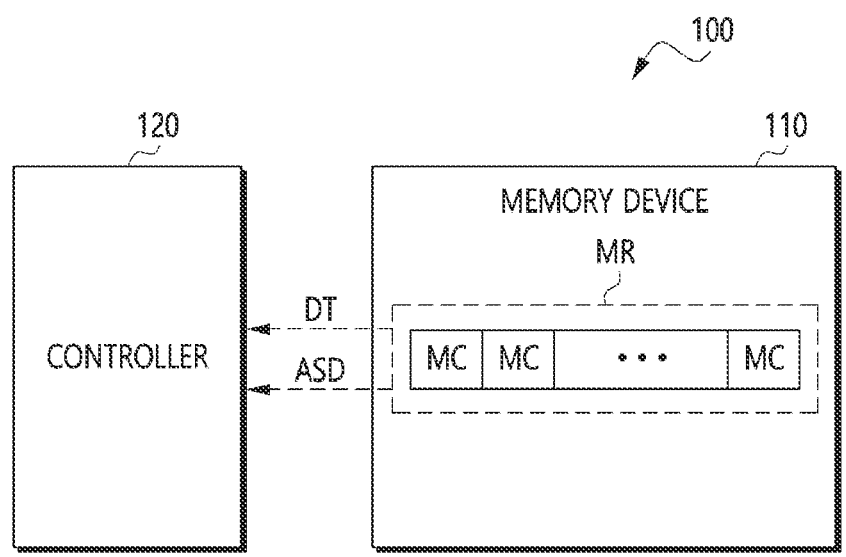
FIG. 1 is a block diagram illustrating a storage device in accordance with an embodiment of the present disclosure.

FIG. 1 is a block diagram illustrating a storage device 100 in accordance with an embodiment of the present disclosure.

The storage device 100 may store data provided from an external device in response to a write request from the external device. Furthermore, the storage device 100 may provide stored data to the external device in response to a read request from the external device.

The storage device 100 may include a personal computer memory card international association (PCMCIA) card, a compact flash (CF) card, a smart media card, a memory stick, various multimedia cards (e.g., MMC, eMMC, RS-MMC, and MMC-micro), secure digital (SD) cards (e.g., SD, Mini-SD and Micro-SD), a universal flash storage (UFS) or a solid-state drive (SSD).

The storage device 100 may include a memory device 110 and a controller 120.

The memory device 110 may operate under the control of the controller 120. Operations of the memory device 110 may include read operations, write operations (i.e., program operations), erase operations and so forth.

The memory device 110 may include a memory region MR including a plurality of memory cells MC. Depending on a number of bits that can be stored in a single memory cell, the memory region MR may include logical sub-regions.

The memory device 110 may be embodied in one or more of various types such as NAND flash memory, 3D NAND flash memory, NOR flash memory, and so forth.

The controller 120 may control overall operations of the storage device 100. The controller 120 may control the storage device 100 in response to a request from an external device. For example, the controller 120 may write data into the memory device 110 in response to a write request from the external device and may read data from the memory device 110 in response to a read request from the external device.

In order to perform a managing operation that is internally required, the controller 120 may control the memory device 110 independently of the external device, i.e., even without a request from the external device. For example, the managing operation may include one or more of a wear-levelling operation, a garbage collection operation, an erase operation and a read-reclaim operation. The managing operation may include operations of writing data into the memory device 110 and reading data from the memory device 110. In an embodiment, the managing operation may be performed in response to a request from an external device.

The controller 120 may perform a read voltage adjusting operation in order to adjust a read voltage utilized during a read operation on a memory region MR. Specifically, the controller 120 may read, based on a first read voltage and a second read voltage having a higher level than the first read voltage, data DT from the plurality of memory cells MC within the memory region MR, and may read, based on an assist read voltage, assist data ASD from the plurality of memory cells MC. The assist read voltage may have a level between the first read voltage and the second read voltage. Based on the data DT and the assist data ASD, the controller 120 may determine a number of memory cells corresponding to a target read voltage selected from the first read voltage and the second read voltage. Based on the determined number of memory cells and an expected number of memory cells, the controller 120 may determine an adjustment value for the target read voltage. In an embodiment, the expected number of memory cells is regarded as known.

In an embodiment, when the first read voltage becomes the target read voltage, the number of memory cells may be a number of memory cells having lower threshold voltages than the target read voltage among the plurality of memory cells MC. In this case, the controller 120 may lower the target read voltage by the adjustment value when the number of memory cells is greater than the expected number of memory cells, and may raise the target read voltage by the adjustment value when the number of memory cells is less than the expected number of memory cells.

In an embodiment, when the second read voltage becomes the target read voltage, the number of memory cells may be a number of memory cells having higher threshold voltages than the target read voltage among the plurality of memory cells MC. In this case, the controller 120 may raise the target read voltage by the adjustment value when the number of memory cells is greater than the expected number of memory cells, and may lower the target read voltage by the adjustment value when the number of memory cells is less than the expected number of memory cells.

In an embodiment, the controller 120 may determine, based on an expected threshold voltage distribution, a first threshold voltage corresponding to a number of errors, which represents a difference between the number of memory cells and the expected number of memory cells. The controller 120 may determine, based on the expected threshold voltage distribution, a second threshold voltage corresponding to a predetermined adjustment number of errors. The controller 120 may determine, as the adjustment value, a difference between the first threshold voltage and the second threshold voltage. The predetermined adjustment number of errors may be equal to or less than a number of errors that can be corrected through an error correcting operation. In an embodiment, the expected threshold voltage distribution is regarded as known.

In an embodiment, the target read voltage may be one of the lowest read voltage and the highest read voltage among a plurality of read voltages utilized during a read operation on the memory cells MC.

In an embodiment, the controller 120 may read, with the assist read voltage, assist data ASD from the plurality of memory cells MC during a read voltage adjusting operation on a first sub-region as a target sub-region among logical sub-regions included in the memory region MR, and may re-utilize the read assist data ASD during the read voltage adjusting operation on a second sub-region as the target sub-region among the logical sub-regions.

In the following description, a target read voltage may be a read voltage that is to be adjusted through a read voltage adjusting operation. A target sub-region or a target page may be a sub-region or a page, on which a read operation is performed with the target read voltage.

In accordance with an embodiment, when a current read voltage is not adequate due to a status change of the memory cells MC, a read voltage adjusting operation may be effectively performed on the current read voltage thereby promptly and stably obtaining the data DT stored in the memory device 110.

Figure 2:
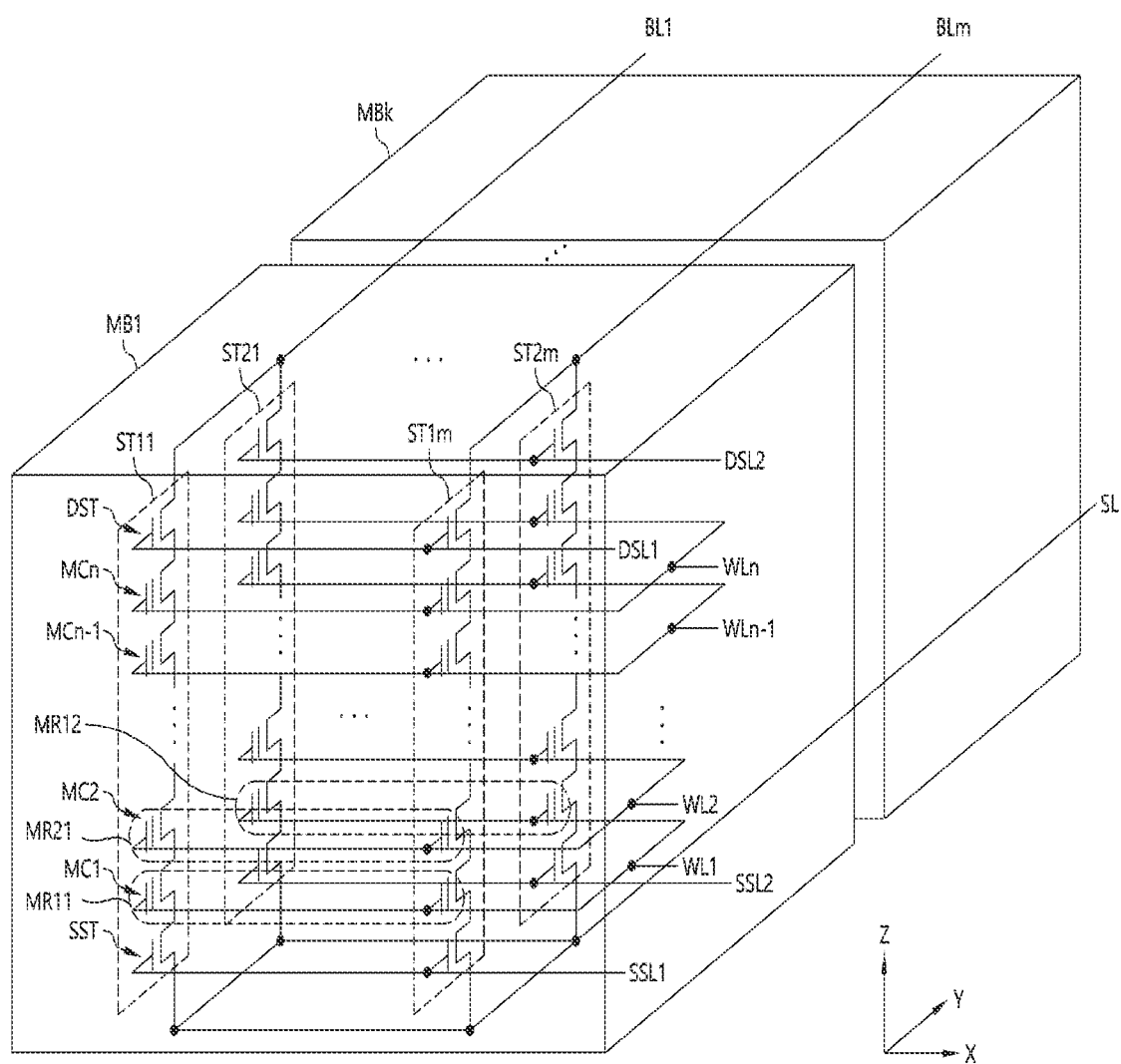
FIG. 2 is a circuit diagram illustrating a memory block included in a memory device of FIG. 1 in accordance with an embodiment of the present disclosure.

FIG. 2 is a circuit diagram illustrating a memory block MB1 included in the memory device 110 of FIG. 1 in accordance with an embodiment of the present disclosure.

Referring to FIG. 2, the memory block MB1 may include a plurality of strings ST11 to ST1$m$ and ST21 to ST2$m$. Each of the strings ST11 to ST1$m$ and ST21 to ST2$m$ may extend along a vertical direction (i.e., a direction of the Z axis). Within the memory block MB1, "m" number of strings may be arranged along a row direction (i.e., a direction of the X axis). Although FIG. 2 illustrates 2 string groups (each string group being of "m" number of strings) arranged along a column direction (i.e., a direction of the Y axis), 3 or more string groups may be arranged along the column direction.

The strings ST11 to ST1$m$ and ST21 to ST2$m$ may be configured in the same way. For example, the string ST11 may include a source selection transistor SST, memory cells MC1 to MCn and a drain selection transistor DST, which are serially coupled to each other between the source line SL and the bit line BL1. A source of the source selection transistor SST may be coupled to the source line SL. A drain of the drain selection transistor DST may be coupled to the bit line BL1. The memory cells MC1 to MCn may be serially coupled to each other between the source selection transistor SST and the drain selection transistor DST.

Gates of the source selection transistors SST within a group of the strings ST11 to ST1$m$ or ST21 to ST2$m$ arranged in the same row may be coupled to the same source selection line. For example, gates of the source selection transistors SST within the respective strings ST11 to ST1$m$ arranged in the first row may be coupled to the source selection line SSL1. Gates of the source selection transistors SST within the respective strings ST21 to ST2$m$ arranged in the second row may be coupled to the source selection line SSL2. In an embodiment, the source selection transistors SST within the respective strings ST11 to ST1$m$ and ST21 to ST2$m$ may be commonly coupled to a singles source selection line.

Gates of the drain selection transistors DST within a group of the strings ST11 to ST1$m$ or ST21 to ST2$m$ arranged in the same row may be coupled to the same drain selection line. For example, gates of the drain selection transistors DST within the respective strings ST11 to ST1$m$ arranged in the first row may be coupled to the drain selection line DSL1. Gates of the drain selection transistors DST within the respective strings ST21 to ST2$m$ arranged in the second row may be coupled to the drain selection line DSL2.

The strings arranged in the same column may be coupled to the same bit line. For example, the strings ST11 and ST21 arranged in the first column may be coupled to the bit line BL1. The strings ST1$m$ and ST2$m$ arranged in the m-th column may be coupled to the bit line BLm.

Gates of the memory cells arranged in the same location in the vertical direction may be coupled to the same word line. For example, gates of the memory cells arranged in the same location as the memory cell MC1 in the vertical direction within the strings ST11 to ST1$m$ and ST21 to ST2$m$ may be coupled to the word line WL1.

Among the memory cells within the memory block MB1, memory cells arranged in the same row and coupled to the same word line may configure a single memory region. For example, the memory cells arranged in the first row and coupled to the word line WL1 may configure a memory region MR11. The memory cells arranged in the second row and coupled to the word line WL1 may configure a memory region MR12. The memory cells arranged in the first row and coupled to the word line WL2 may configure a memory region MR21.

Depending on a number of rows, each word line may be coupled to a plurality of memory regions. The memory cells configuring a single memory region may be programmed at the same time.

In an embodiment, the memory block MB1 may be coupled further to one or more dummy word lines as well as the word lines WL1 to WLn and may further include dummy memory cells coupled to the dummy word lines.

Figure 3:
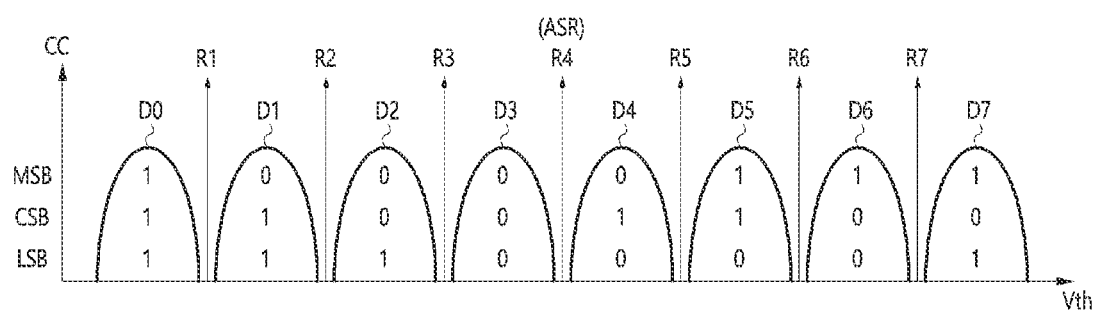
FIG. 3 is a diagram illustrating threshold voltage distributions of memory cells in accordance with an embodiment of the present disclosure.

FIG. 3 is a diagram illustrating threshold voltage distributions D0 to D7 of memory cells in accordance with an embodiment of the present disclosure. The horizontal axis Vth may represent threshold voltages of the memory cells and the vertical axis CC may represent a number of memory cells having a corresponding threshold voltage.

Referring to FIG. 3, each of the memory cells may be a triple level cell (TLC) configured to store therein 3 bits, i.e., least significant bit (LSB), central significant bit (CSB) and most significant bit (MSB). In this case, the memory cells may form threshold voltage distributions D0 to D7 according to data stored therein. The memory cells forming the threshold voltage distributions D0 to D7 may be ones included in a single memory region. During a write operation, each memory cell may be controlled to form one of the eight (8) number of threshold voltage distributions D0 to D7 according to 3-bit data stored therein. For example, a memory cell storing data '111' may form the threshold voltage distribution D0. In an embodiment, when 'k' number of bits can be stored in each of the memory cells, the memory cells may form '$2^k$' number of threshold voltage distributions.

When each memory cell is a TLC within a memory region, the memory region may logically include three (3) number of sub-regions, i.e., a LSB page that is a lowest-level page capable of storing therein LSB data, a CSB page that is a middle-level page capable of storing therein CSB data and a MSB page that is a highest-level page capable of storing therein MSB data. When each memory cell can store therein 'k' bits within a memory region, the memory region may logically include 'k' number of sub-regions or pages.

When a read voltage is applied to a word line, a memory cell coupled to the word line may be turned on or off according to its threshold voltage. Specifically, the memory cell may be turned on when the read voltage is higher than its threshold voltage and may be turned off when the read voltage is lower than its threshold voltage. The memory cell may induce different amounts of a current when it is turned on and off. The memory device 110 may determine whether the threshold voltage of the memory cell is higher or lower than the read voltage by sensing the current. When each of the read voltages R1 to R7 having respectively levels between the threshold voltage distributions D0 to D7 (i.e., in valleys of the threshold voltage distributions D0 to D7) are applied to a memory cell, the memory device 110 may determine whether the threshold voltage of the memory cell is higher or lower than each of the read voltages R1 to R7. Therefore, the memory device 110 may determine, by utilizing the read voltages R1 to R7, the threshold voltage distribution formed by the memory cell and may read data from the memory cell.

For example, LSB data stored in a LSB page may be read out by the read voltages R3 and R7 (hereinafter, referred to as LSB read voltages). That is, when a memory cell has a threshold voltage lower than the read voltage R3 or higher than the read voltage R7, LSB data of a value of one (1) may be read out from the memory cell. Further, when a memory cell has a threshold voltage higher than the read voltage R3 and lower than the read voltage R7, LSB data of a value of zero (0) may be read out from the memory cell. In a similar way, CSB data stored in a CSB page may be read out by the read voltages R2, R4 and R6 (hereinafter, CSB read voltages). Also, MSB data stored in a MSB page may be read out by the read voltages R1 and R5 (hereinafter, MSB read voltages). When data codes assigned to the respective threshold voltage distributions D0 to D7 changes, for example, when a data code other than the data code '111' is assigned to the threshold voltage distribution D1, the read voltages to read respective pages may change.

The threshold voltage distributions D0 to D7 may move when threshold voltages of memory cells change due to various reasons. The change of threshold voltage may mean deterioration of data. Specifically, a memory cell belonging to the highest threshold voltage distribution D7 may have a weak retention characteristic and therefore a threshold voltage of the memory cell may be prone to move in a direction that the threshold voltage falls in. In this case, it may be hard to clearly discriminate between the threshold voltage distributions D6 and D7 with the read voltage R7. On the other hand, a memory cell belonging to the lowest threshold voltage distribution D0 may be greatly affected by read disturb and therefore a threshold voltage of the memory cell may be prone to move in a direction that the threshold voltage rises. In this case, it may be hard to clearly discriminate between the threshold voltage distributions D0 and D1 with the read voltage R1. In view of such phenomena, the highest threshold voltage distribution D7 and the lowest threshold voltage distribution D0 may be vulnerable threshold voltage distributions. A page to be read by the highest read voltage R7 (e.g., the LSB page illustrated in FIG. 4) and a page to be read by the lowest read voltage R1 (e.g., the MSB page illustrated in FIG. 4) may be vulnerable pages, in which stored data are vulnerable to deterioration. When the data read from such vulnerable pages have a number of errors which is greater than an error correcting capability or a number of errors correctable through an error correcting operation of the storage device 100, a read operation may be eventually determined as failed. Therefore, when the threshold voltage distributions D0 to D7 move, it may be required to adjust the read voltages R1 to R7 to be located in the valleys of the threshold voltage distributions D0 to D7. Especially, it may be required to more rapidly and precisely adjust the lowest read voltage R1 and the highest read voltage R7 neighboring the vulnerable threshold voltage distributions D0 and D7.

In order to adjust the read voltages R1 to R7, the controller 120 may perform a read voltage adjusting operation. The read voltage adjusting operation may be triggered when an error correcting operation fails on data DT read from a target page. In an embodiment, the read voltage adjusting operation may be triggered because of various reasons. The read voltage adjusting operation may include an operation of reading, with an assist read voltage ASR, assist data ASD from memory cells including a target page. The assist data ASD may be read, as having a first value (e.g., a value of one (1)), from a memory cell having a threshold voltage lower than the assist read voltage ASR and may be read, as having a second value (e.g., a value of zero (0)), from a memory cell having a threshold voltage higher than the assist read voltage ASR. That is, by identifying the assist data ASD, it may be determined whether the memory cell has the threshold voltage higher or lower than the assist read voltage ASR.

As illustrated in FIG. 3, the assist read voltage ASR may be the read voltage R4 having a middle level among all read voltages R1 to R7. In an embodiment, the assist read voltage ASR may be a voltage having a level between two (2) numbers of read voltages for reading a target page. In other words, the assist read voltage ASR may be a voltage having a level between read voltages to be adjusted in the read voltage adjusting operation. For example, the assist read voltage ASR may have a level between the LSB read voltages R3 and R7 when the LSB page is a target page. In an embodiment, the assist read voltage ASR may have an average level of all read voltages R1 to R7.

Figure 4:
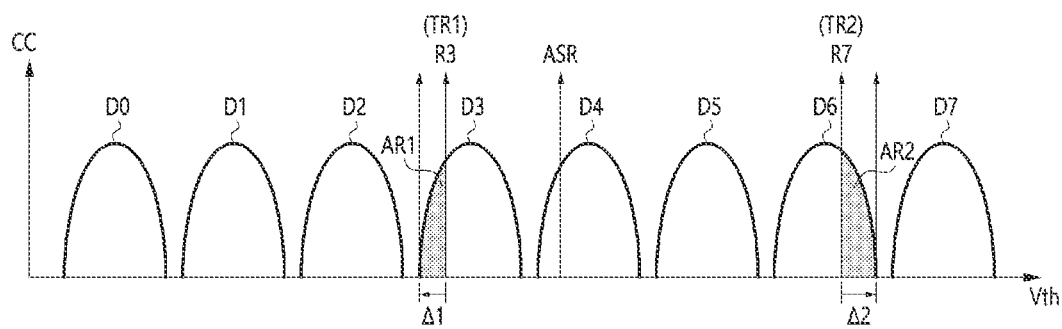
FIG. 4 is a diagram illustrating an operation of determining adjustment directions of respective LSB read voltages during a read voltage adjusting operation on the LSB read voltages in accordance with an embodiment of the present disclosure.

FIG. 4 is a diagram illustrating an operation of determining adjustment directions of the respective LSB read voltages R3 and R7 during a read voltage adjusting operation on the LSB read voltages R3 and R7 in accordance with an embodiment of the present disclosure.

Referring to FIG. 4 illustrating a situation that LSB data has an error due to movement of the threshold voltage distributions D0 to D7, a read voltage adjusting operation may be performed by setting, between the LSB read voltages R3 and R7, the lower LSB read voltage R3 as a first target read voltage TR1 and the higher LSB read voltage R7 as a second target read voltage TR2. In order to perform the read voltage adjusting operation, the controller 120 may read, with an assist read voltage ASR, assist data ASD from memory cells. Based on the LSB data and the assist data ASD, the controller 120 may determine a first number CC1 of memory cells and a second number CC2 of memory cells. The first number CC1 of memory cells may be a number of memory cells having lower threshold voltages than the first target read voltage TR1. The second number CC2 of memory cells may be a number of memory cells having higher threshold voltages than the second target read voltage TR2.

Specifically, the controller 120 may determine the first number CC1 of memory cells by counting a number of memory cells, from which the LSB data is read as having a value of one (1) and the assist data ASD is read as having a value of one (1). Also, the controller 120 may determine the second number CC2 of memory cells by counting a number of memory cells, from which the LSB data is read as having a value of one (1) and the assist data ASD is read as having a value of zero (0).

In a predetermined manner, the controller 120 may determine a first expected number EC1 of memory cells and a second expected number EC2 of memory cells. The first expected number EC1 of memory cells may correspond to the first number CC1 of memory cells. The second expected number EC2 of memory cells may correspond to the second number CC2 of memory cells. The first expected number EC1 of memory cells may be an expected value of the first number CC1 of memory cells and may be an ideal value of the first number CC1 of memory cells when data is not deteriorated. The second expected number EC2 of memory cells may be an expected value of the second number CC2 of memory cells and may be an ideal value of the second number CC2 of memory cells when data is not deteriorated. For example, a total number of memory cells is eight hundred (800) within a single memory region and the threshold voltage distributions D0 to D7 are evenly formed, each of the threshold voltage distributions D0 to D7 may correspond to one hundred (100) number of memory cells, which is a value obtained by dividing the total number of memory cells by the eight (8) number of threshold voltage distributions D0 to D7. In this case, the first target read voltage TR1 may be desirable to have a level between the threshold voltage distributions D2 and D3 and therefore the first expected number EC1 of memory cells may be three hundred (300). Also, the second target read voltage TR2 may be desirable to have a level between the threshold voltage distributions D6 and D7 and therefore the second expected number EC2 of memory cells may be one hundred (100).

The controller 120 may compare the first number CC1 of memory cells and the first expected number EC1 of memory cells with each other to determine an adjustment direction of the first target read voltage TR1, i.e., plus or minus a first adjustment value Δ1. Specifically, a first number AC1 of errors, which is twenty (20), as a difference between the first number CC1 of memory cells, which is three hundred and twenty (320), and the first expected number EC1 of memory cells, which is three hundred (300), may be a number of memory cells belonging to a first error region AR1. When the first number CC of memory cells is greater than the first expected number EC1 of memory cells, the controller 120 may adjust the first target read voltage TR1 by adding the negative first adjustment value Δ 1 to the first target read voltage TR1 (i.e., by lowering the first target read voltage TR1 by the first adjustment value Δ 1), such that the first error region AR1 shrinks. Described with reference to FIGS. 5A and 5B will be an operation of determining the first adjustment value Δ 1.

The controller 120 may compare the second number CC2 of memory cells and the second expected number EC2 of memory cells with each other to determine an adjustment direction of the second target read voltage TR2, i.e., plus or minus of a second adjustment value Δ 2. Specifically, a second number AC2 of errors, which is thirty (30), as a difference between the second number CC2 of memory cells, which is one hundred and thirty (130), and the second expected number EC2 of memory cells, which is one hundred (100), may be a number of memory cells belonging to a second error region AR2. When the second number CC2 of memory cells is greater than the second expected number EC2 of memory cells, the controller 120 may adjust the second target read voltage TR2 by adding the positive second adjustment value Δ 2 to the second target read voltage TR2 (i.e., by raising the second target read voltage TR2 by the second adjustment value Δ 2), such that the second error region AR2 shrinks.

When the first number CC of memory cells is less than the first expected number EC1 of memory cells, the controller 120 may adjust the first target read voltage TR1 by adding the positive first adjustment value Δ 1 to the first target read voltage TR1 (i.e., by raising the first target read voltage TR1 by the first adjustment value Δ 1). When the second number CC2 of memory cells is less than the second expected number EC2 of memory cells, the controller 120 may adjust the second target read voltage TR2 by adding the negative second adjustment value Δ2 to the second target read voltage TR2 (i.e., by lowering the second target read voltage TR2 by the second adjustment value Δ 2). These situations will be described in more detail through an example of FIG. 7.

Figure 5A:
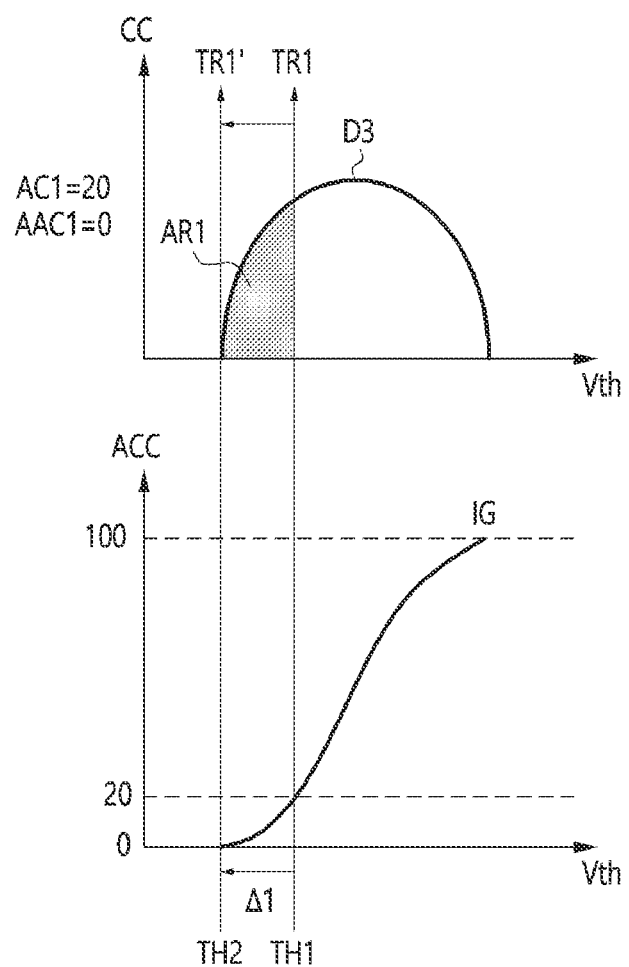
FIGS. 5A and 5B are diagrams for describing an operation of determining a first adjustment value of FIG. 4 in accordance with an embodiment of the present disclosure.
Figure 5B:
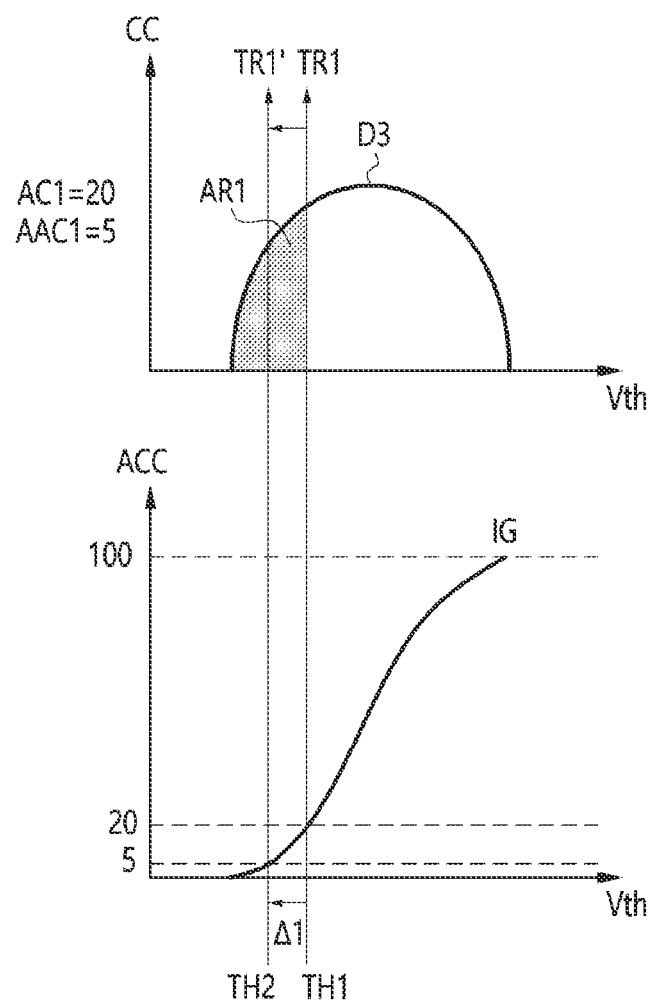

FIGS. 5A and 5B are diagrams for describing an operation of determining the first adjustment value Δ1 of FIG. 4 in accordance with an embodiment of the present disclosure.

Referring to FIG. 5A, the graph IG may represent an accumulated number ACC of memory cells having respective threshold voltages in an expected (i.e., ideal) threshold voltage distribution. That is, the accumulated number ACC of memory cells represented by the graph IG may be a number of memory cells having a selected threshold voltage or the lower threshold voltages among memory cells forming the expected (i.e., ideal) threshold voltage distribution within a selected threshold voltage range. In an embodiment, the graph IG and the accumulated number ACC of memory cells are regarded as known.

As described above with reference to FIG. 4, the first number AC1 of errors, i.e., the number of memory cells belonging to the first error region AR1, may be twenty (20). Therefore, a first threshold voltage TH1 corresponding to the first number AC1 of errors may be specified according to the graph IG. Among the memory cells belonging to the expected threshold voltage distribution, the memory cells having the first threshold voltage TH1 and the lower threshold voltages may be as many as the first number AC1 of errors. Further, the first error region AR1 or the first number AC1 of errors should shrink and therefore the first adjustment value Δ 1 for the first target read voltage TR1 may be determined as negative. Specifically, if the first number AC1 of errors is to shrink from twenty (20) to zero (0), a first adjustment number AAC1 of errors may be selected to have a value of zero (0). The first adjustment number AAC1 of errors may be a target value, to which the first number AC1 of errors should shrink through the adjustment of the first target read voltage TR1. Further, based on the graph IG, the first adjustment value Δ 1 may be determined as a difference between the first threshold voltage TH1 and a second threshold voltage TH2, the first threshold voltage TH1 corresponding to the first number AC1 of errors and the second threshold voltage TH2 corresponding to the first adjustment number AAC1 of errors. The first target read voltage TR1 may fall by the first adjustment value Δ 1 to become an adjusted first target read voltage TR1', which may have a level in a valley between the threshold voltage distributions D2 and D3.

Referring to FIG. 5B, in an embodiment, when the first number AC1 of errors shrinks to five (5), the controller 120 having the error correcting capability of five (5) may correct all errors in read data. Therefore, when the first number AC1 of errors shrinks from twenty (20) to five (5) in consideration of the error correcting capability of the controller 120, the first adjustment number AAC1 of errors may be selected to have a value of five (5). Further, based on the graph IG, the first adjustment value Δ1 may be determined as a difference between the first threshold voltage TH1 and the second threshold voltage TH2, the first threshold voltage TH1 corresponding to the first number AC1 of errors and the second threshold voltage TH2 corresponding to the first adjustment number AAC1 of errors. The first target read voltage TR1 may fall by the first adjustment value Δ1 to become an adjusted first target read voltage TR1', which may have a level other than in a valley between the threshold voltage distributions D2 and D3. This situation may cause five (5) error-bits, which can be corrected by an error correcting operation of the controller 120 because the five (5) error-bits fall in the range of the error correcting capability of the controller 120.

Figure 6A:
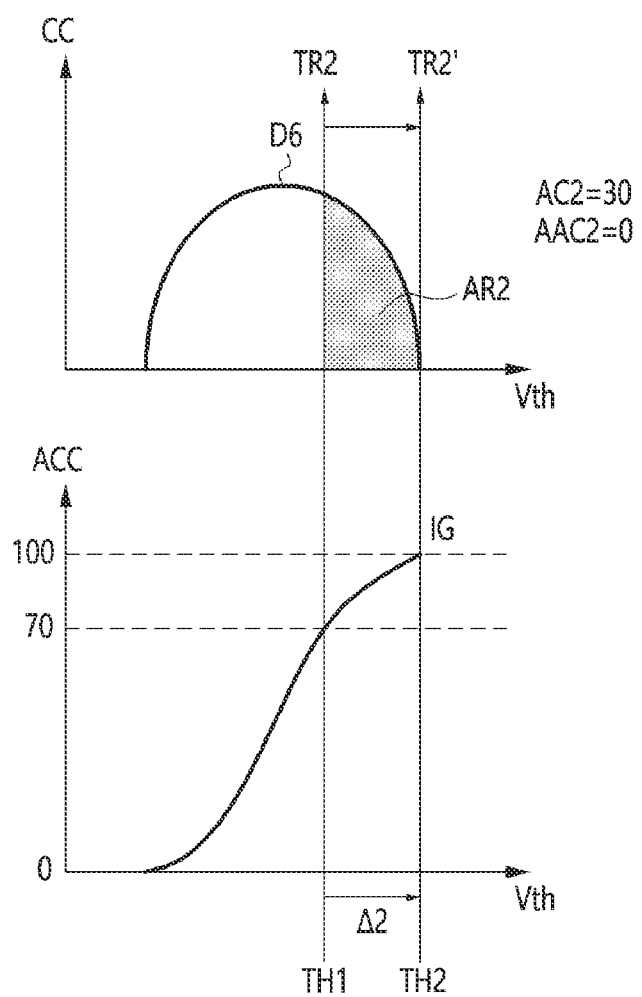
FIGS. 6A and 6B are diagrams for describing an operation of determining a second adjustment value of FIG. 4 in accordance with an embodiment of the present disclosure.
Figure 6B:
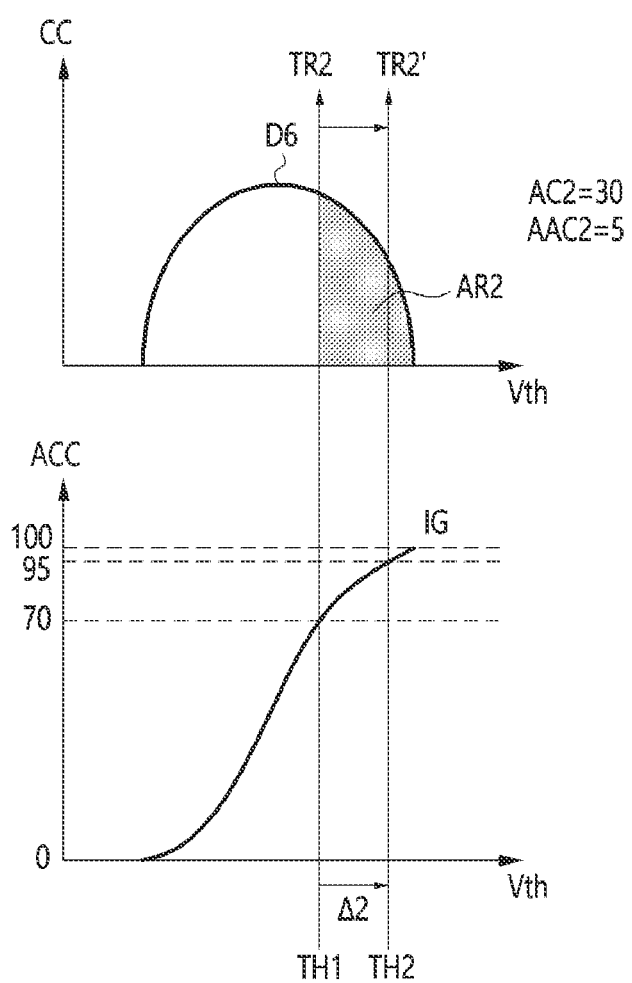

FIGS. 6A and 6B are diagrams for describing an operation of determining the second adjustment value Δ2 of FIG. 4 in accordance with an embodiment of the present disclosure.

Referring to FIG. 6A, the second number AC2 of errors, i.e., the number of memory cells belonging to the second error region AR2, may be thirty (30). That is, among the memory cells belonging to the threshold voltage distribution D6, a number of memory cells having the second target read voltage TR2 or the lower threshold voltages may be seventy (70). Therefore, a first threshold voltage TH1 corresponding to the second number AC2 of errors may be specified according to the graph IG. Among the memory cells belonging to the expected threshold voltage distribution, the memory cells having the first threshold voltage TH1 and the higher threshold voltages may be as many as the second number AC2 of errors. Further, the second error region AR2 or the second number AC2 of errors should shrink and therefore the second adjustment value Δ2 for the second target read voltage TR2 may be determined as positive. Specifically, if the second number AC2 of errors shrinks from thirty (30) to zero (0), a second adjustment number AAC2 of errors may be selected to have a value of zero (0). The second adjustment number AAC2 of errors may be a target value, to which the second number AC2 of errors should shrink through the adjustment of the second target read voltage TR2. Further, based on the graph IG, the second adjustment value Δ2 may be determined as a difference between the first threshold voltage TH1 and a second threshold voltage TH2, the first threshold voltage TH1 corresponding to the second number AC2 of errors and the second threshold voltage TH2 corresponding to the second adjustment number AAC2 of errors. The second target read voltage TR2 may rise by the second adjustment value Δ2 to become an adjusted second target read voltage TR2', which may have a level in a valley between the threshold voltage distributions D6 and D7.

Referring to FIG. 6B, in an embodiment, when the second number AC2 of errors shrinks to five (5), the controller 120 having the error correcting capability of five (5) may correct all errors in read data. Therefore, when the second number AC2 of errors shrinks from thirty (30) to five (5) in consideration of the error correcting capability of the controller 120, the second adjustment number AAC2 of errors may be selected to have a value of five (5). Further, based on the graph IG, the second adjustment value Δ2 may be determined as a difference between the first threshold voltage TH1 and the second threshold voltage TH2, the first threshold voltage TH1 corresponding to the second number AC2 of errors and the second threshold voltage TH2 corresponding to the second adjustment number AAC2 of errors. The second target read voltage TR2 may rise by the second adjustment value Δ2 to become an adjusted second target read voltage TR2', which may have a level other than in a valley between the threshold voltage distributions D6 and D7. This situation may cause five (5) error-bits, which can be corrected by an error correcting operation of the controller 120 because the five (5) error-bits fall in the range of the error correcting capability of the controller 120.

In an embodiment, the adjustment value may be determined on a basis of the graph IG by referring to a lookup table corresponding to the graph IG. In an embodiment, the adjustment value may be determined on a basis of the graph IG by calculating a function formula corresponding to the graph IG.

Therefore, the first target read voltage TR1 and the second target read voltage TR2 may be rapidly adjusted by additionally performing a read operation with the assist read voltage ASR. Especially, the second target read voltage TR2 related to the vulnerable threshold voltage distribution D7 may be rapidly adjusted to promptly and stably obtain the LSB data.

Figure 7:
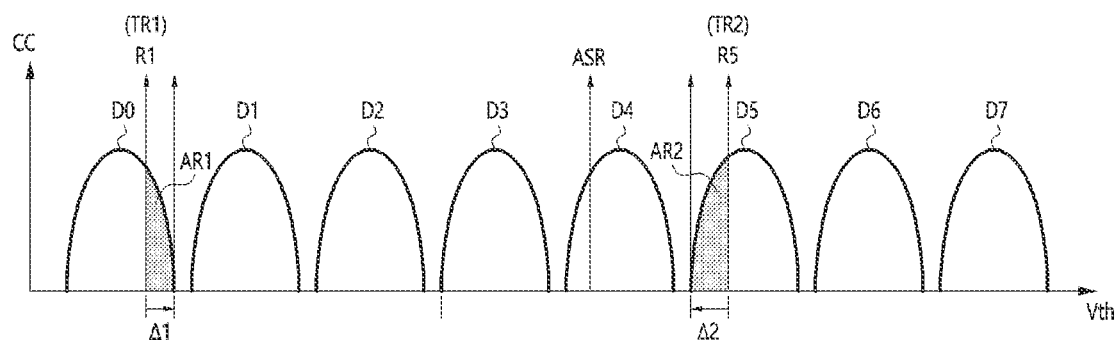
FIG. 7 is a diagram illustrating an operation of determining adjustment directions of respective MSB read voltages during a read voltage adjusting operation on the MSB read voltages in accordance with an embodiment of the present disclosure.

FIG. 7 is a diagram illustrating an operation of determining adjustment directions of the respective MSB read voltages R1 and R5 during a read voltage adjusting operation on the MSB read voltages R1 and R5 in accordance with an embodiment of the present disclosure.

Referring to FIG. 7 illustrating a situation in which MSB data has an error, a read voltage adjusting operation may be performed by setting, between the MSB read voltages R1 and R5, the lower MSB read voltage R1 as a first target read voltage TR1 and the higher MSB read voltage R5 as a second target read voltage TR2. The read voltage adjusting operation on the MSB read voltages R1 and R5 may be performed in the similar manner to the read voltage adjusting operation on the LSB read voltages R3 and R7 as discussed with reference to FIG. 4. In an embodiment, when the read voltage adjusting operation on the MSB read voltages R1 and R5 is performed consecutively to the read voltage adjusting operation on the LSB read voltages R3 and R7 and when the assist read voltage ASR is between the LSB read voltages R3 and R7 and between the MSB read voltages R1 and R5, the assist data ASD read during the read voltage adjusting operation on the LSB read voltages R3 and R7 may be re-utilized during the read voltage adjusting operation on the MSB read voltages R1 and R5. That is, the assist data ASD read during the read voltage adjusting operation on the LSB read voltages R3 and R7 may be separately secured and the operation of reading the assist data ASD may be omitted during the read voltage adjusting operation on the MSB read voltages R1 and R5.

Specifically, based on the MSB data and the assist data ASD, the controller 120 may determine a first number CC1 of memory cells and a second number CC2 of memory cells. The first number CC1 of memory cells may be a number of memory cells having lower threshold voltages than the first target read voltage TR1. The second number CC2 of memory cells may be a number of memory cells having higher threshold voltages than the second target read voltage TR2. The controller 120 may determine the first number CC1 of memory cells by counting a number of memory cells, from which the MSB data is read as having a value of one (1) and the assist data ASD is read as having a value of one (1). Also, the controller 120 may determine the second number CC2 of memory cells by counting a number of memory cells, from which the MSB data is read as having a value of one (1) and the assist data ASD is read as having a value of zero (0).

In a predetermined manner, the controller 120 may determine a first expected number EC1 of memory cells and a second expected number EC2 of memory cells. The first expected number EC1 of memory cells may correspond to the first number CC1 of memory cells. The second expected number EC2 of memory cells may correspond to the second number CC2 of memory cells. The first expected number EC1 of memory cells may be an expected value of the first number CC1 of memory cells and may be an ideal value of the first number CC1 of memory cells when data is not deteriorated. The second expected number EC2 of memory cells may be an expected value of the second number CC2 of memory cells and may be an ideal value of the second number CC2 of memory cells when data is not deteriorated. For example, the first target read voltage TR1 may be desirable to have a level between the threshold voltage distributions D0 and D1 and therefore the first expected number EC1 of memory cells may be one hundred (100). Also, the second target read voltage TR2 may be desirable to have a level between the threshold voltage distributions D4 and D5 and therefore the second expected number EC2 of memory cells may be three hundred (300).

The controller 120 may compare the first number CC1 of memory cells and the first expected number EC1 of memory cells with each other to determine an adjustment direction of the first target read voltage TR1, i.e., plus or minus of a first adjustment value Δ 1. Specifically, a first number AC1 of errors, which is twenty (20), as a difference between the first number CC1 of memory cells, which is eighty (80), and the first expected number EC1 of memory cells, which is one hundred (100), may be a number of memory cells belonging to a first error region AR1. When the first number CC1 of memory cells is less than the first expected number EC1 of memory cells, the controller 120 may adjust the first target read voltage TR1 by adding the positive first adjustment value Δ1 to the first target read voltage TR1 (i.e., by raising the first target read voltage TR1 by the first adjustment value Δ 1), such that the first error region AR1 shrinks.

The controller 120 may compare the second number CC2 of memory cells and the second expected number EC2 of memory cells with each other to determine an adjustment direction of the second target read voltage TR2, i.e., plus or minus a second adjustment value Δ 2. Specifically, a second number AC2 of errors, which is forty (40), as a difference between the second number CC2 of memory cells, which is two hundred and sixty (260), and the second expected number EC2 of memory cells, which is three hundred (300), may be a number of memory cells belonging to a second error region AR2. When the second number CC2 of memory cells is less than the second expected number EC2 of memory cells, the controller 120 may adjust the second target read voltage TR2 by adding the negative second adjustment value Δ 2 to the second target read voltage TR2 (i.e., by lowering the second target read voltage TR2 by the second adjustment value Δ 2), such that the second error region AR2 shrinks.

Figure 8:
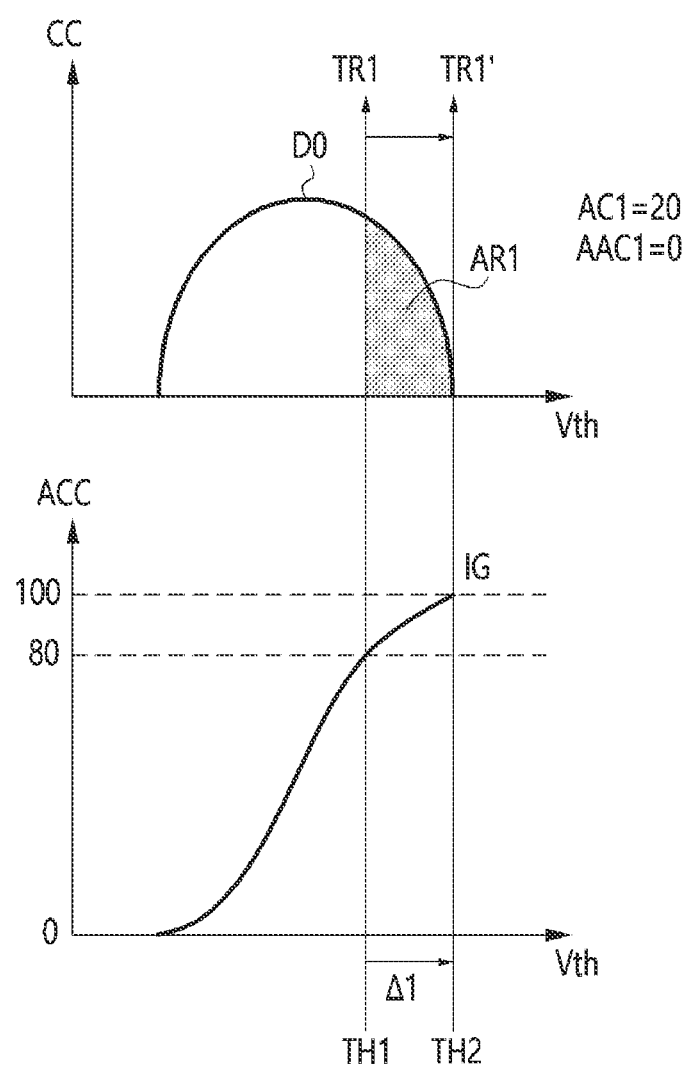
FIG. 8 is a diagram for describing an operation of determining a first adjustment value of FIG. 7 in accordance with an embodiment of the present disclosure.

FIG. 8 is a diagram for describing an operation of determining the first adjustment value Δ1 of FIG. 7 in accordance with an embodiment of the present disclosure.

Referring to FIG. 8, as described above with reference to FIG. 7, the first number AC1 of errors, i.e., the number of memory cells belonging to the first error region AR1, may be twenty (20). Therefore, a first threshold voltage TH1 corresponding to the first number AC1 of errors may be specified according to the graph IG. Among the memory cells belonging to the expected threshold voltage distribution, the memory cells having the first threshold voltage TH1 and the higher threshold voltages may be as many as the first number AC1 of errors. Further, the first error region AR1 or the first number AC1 of errors should shrink and therefore the first adjustment value Δ 1 for the first target read voltage TR1 may be determined as positive. Specifically, if the first number AC1 of errors shrinks from twenty (20) to zero (0), a first adjustment number AAC1 of errors may be selected to have a value of zero (0). The first adjustment number AAC1 of errors may be a target value, to which the first number AC1 of errors should shrink through the adjustment of the first target read voltage TR1. Further, based on the graph IG, the first adjustment value Δ 1 may be determined as difference between the first threshold voltage TH1 and a second threshold voltage TH2, the first threshold voltage TH1 corresponding to the first number AC1 of errors and the second threshold voltage TH2 corresponding to the first adjustment number AAC1 of errors. The first target read voltage TR1 may rise by the first adjustment value Δ 1 to become an adjusted first target read voltage TR1', which may have a level in a valley between the threshold voltage distributions D0 and D1.

In an embodiment, the first adjustment number AAC1 of errors may be selected to have a value falling in the range of the error correcting capability of the controller 120.

Figure 9:
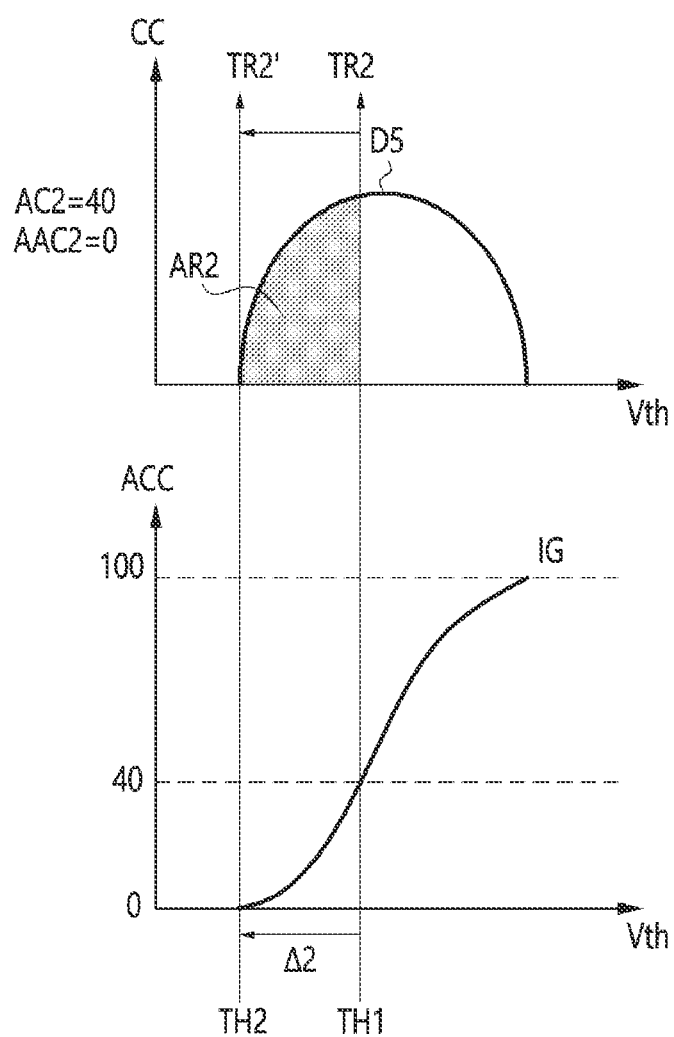
FIG. 9 is a diagram for describing an operation of determining a second adjustment value of FIG. 7 in accordance with an embodiment of the present disclosure.

FIG. 9 is a diagram for describing an operation of determining the second adjustment value Δ2 of FIG. 7 in accordance with an embodiment of the present disclosure.

Referring to FIG. 9, the second number AC2 of errors, i.e., the number of memory cells belonging to the second error region AR2, may be forty (40). Therefore, a first threshold voltage TH1 corresponding to the second number AC2 of errors may be specified according to the graph IG. Among the memory cells belonging to the expected threshold voltage distribution, the memory cells having the first threshold voltage TH1 and the lower threshold voltages may be as many as the second number AC2 of errors. Further, the second error region AR2 or the second number AC2 of errors should shrink and therefore the second adjustment value Δ2 for the second target read voltage TR2 may be determined as negative. Specifically, if the second number AC2 of errors shrinks from forty (40) to zero (0), a second adjustment number AAC2 of errors may be selected to have a value of zero (0). The second adjustment number AAC2 of errors may be a target value, to which the second number AC2 of errors should shrink through the adjustment of the second target read voltage TR2. Further, based on the graph IG, the second adjustment value Δ2 may be determined as a difference between the first threshold voltage TH1 and a second threshold voltage TH2, the first threshold voltage TH1 corresponding to the second number AC2 of errors and the second threshold voltage TH2 corresponding to the second adjustment number AAC2 of errors. The second target read voltage TR2 may fall by the second adjustment value Δ2 to become an adjusted second target read voltage TR2', which may have a level in a valley between the threshold voltage distributions D4 and D5.

In an embodiment, the second adjustment number AAC2 of errors may be selected to have a value falling in the range of the error correcting capability of the controller 120.

FIG. 10 is a flowchart illustrating a read voltage adjusting operation of the controller 120 of FIG. 1 in accordance with an embodiment of the present disclosure.

Referring to FIG. 1, at operation S110, the controller 120 may read data DT from memory cells MC included in a memory region MR according to a first read voltage and a second read voltage having a higher level than the first read voltage.

At operation S120, the controller 120 may determine whether assist data ASD exists, the assist data ASD being read from the memory cells MC. When the assist data ASD does not exist, the process may proceed to operation S130. When the assist data ASD exists, the process may proceed to operation S140.

At operation S130, the controller 120 may read the assist data ASD from the memory cells MC according to an assist read voltage ASR. The assist read voltage ASR may have a level between the first and second read voltages.

At operation S140, based on the data DT and the assist data ASD, the controller 120 may determine a number of memory cells corresponding to a target read voltage. When the first read voltage becomes the target read voltage, the number of memory cells may be a number of memory cells having lower threshold voltages than the target read voltage among the plurality of memory cells MC. When the second read voltage becomes the target read voltage, the number of memory cells may be a number of memory cells having higher threshold voltages than the target read voltage among the plurality of memory cells MC.

At operation S150, based on the determined number of memory cells and an expected number of memory cells, the controller 120 may determine an adjustment value for the target read voltage. The controller 120 may determine, based on an expected threshold voltage distribution, a first threshold voltage corresponding to a number of errors, which represents difference between the number of memory cells and the expected number of memory cells. The controller 120 may determine, based on the expected threshold voltage distribution, a second threshold voltage corresponding to a predetermined adjustment number of errors. The controller 120 may determine, as the adjustment value, a difference between the first threshold voltage and the second threshold voltage.

At operation S160, the controller 120 may adjust the target read voltage by the adjustment value. In a case that the first read voltage is the target read voltage, the controller 120 may lower the target read voltage by the adjustment value when the number of memory cells is greater than the expected number of memory cells and may raise the target read voltage by the adjustment value when the number of memory cells is less than the expected number of memory cells. In a case that the second read voltage is the target read voltage, the controller 120 may raise the target read voltage by the adjustment value when the number of memory cells is greater than the expected number of memory cells and may lower the target read voltage by the adjustment value when the number of memory cells is less than the expected number of memory cells.

In accordance with an embodiment, a storage device and an operating method of a controller may effectively perform a read voltage adjusting operation thereby promptly and stably obtaining data stored in a memory device.

While certain embodiments have been described above, it will be understood to those skilled in the art that the embodiments described are by way of example only. Accordingly, the storage device and operating method of controller should not be limited based on the described embodiments. Rather, the storage device and operating method of controller described herein should only be limited in light of the claims that follow when taken in conjunction with the above description and accompanying drawings. Furthermore, the embodiments may be combined to form additional embodiments.

What is claimed is:

1. A storage device comprising:
a memory device including a memory region which includes a first sub-region and a second sub-region; and
a controller configured to:
read assist data from a plurality of memory cells according to an assist read voltage during a read voltage adjusting operation on the first sub-region as a target sub-region, and
re-utilize the read assist data during the read voltage adjusting operation on the second sub-region as the target sub-region,
wherein the controller is further configured to:
read data from the target sub-region according to a target read voltage,
determine, based on the data and the assist data, a number of memory cells corresponding to the target read voltage, and
adjust the target read voltage based on the number of memory cells and an expected number of memory cells.

2. The storage device of claim 1, wherein the assist read voltage has a level between a first read voltage and a second read voltage utilized during the read voltage adjusting operation on the target sub-region.

3. The storage device of claim 1,
wherein the controller determines the number of memory cells having lower threshold voltages than the target read voltage among memory cells included in the memory region when the target read voltage is the lowest read voltage among read voltages utilized during a read operation on the target sub-region, and
wherein the controller determines the number of memory cells having higher threshold voltages than the target read voltage among the memory cells when the target read voltage is the highest read voltage among the read voltages.

4. The storage device of claim 3,
wherein, in a case that the target read voltage is the lowest read voltage, the controller is further configured to:
lower the target read voltage by an adjustment value when the number of memory cells is greater than the expected number of memory cells, and
raise the target read voltage by the adjustment value when the number of memory cells is less than the expected number of memory cells, and
wherein, in a case that the target read voltage is the highest read voltage, the controller is further configured to:
raise the target read voltage by the adjustment value when the number of memory cells is greater than the expected number of memory cells, and
lower the target read voltage by the adjustment value when the number of memory cells is less than the expected number of memory cells.

5. A storage device comprising:
a memory device including a plurality of memory cells; and
a controller configured to:
determine a number of errors corresponding to a target read voltage among a plurality of read voltages,
determine, based on an expected threshold voltage distribution, a first threshold voltage corresponding to the number of errors, determine, based on the expected threshold voltage distribution, a second threshold voltage corresponding to an adjusted number of errors that is equal to or less than a number of errors that can be corrected through an error correcting operation, and determine, as an adjustment value for the target read voltage, a difference between the first threshold voltage and the second threshold voltage.

6. The storage device of claim 5, wherein the controller is configured to determine, as the number of errors, a difference between an expected number of memory cells and a number of memory cells corresponding to the target read voltage.

7. The storage device of claim 6, wherein the controller is further configured to:

read data from the plurality of memory cells according to a first read voltage and a second read voltage having a higher level than the first read voltage, read assist data from the plurality of memory cells according to an assist read voltage having a level between the first read voltage and the second read voltage, and determine the number of memory cells based on the data and the assist data.

8. The storage device of claim 7, wherein the controller is configured to determine the number of memory cells having lower threshold voltages than the target read voltage among the plurality of memory cells when the target read voltage is the first read voltage, and wherein the controller is configured to determine the number of memory cells having higher threshold voltages than the target read voltage among the plurality of memory cells when the target read voltage is the second read voltage.

9. The storage device of claim 7, wherein, in a case that the target read voltage is the first read voltage, the controller is further configured to:

lower the target read voltage by the adjustment value when the number of memory cells is greater than the expected number of memory cells, and raise the target read voltage by the adjustment value when the number of memory cells is less than the expected number of memory cells, and wherein, in a case that the target read voltage is the second read voltage, the controller is further configured to:

raise the target read voltage by the adjustment value when the number of memory cells is greater than the expected number of memory cells, and lower the target read voltage by the adjustment value when the number of memory cells is less than the expected number of memory cells.

10. An operating method of a controller included in a storage device, the operating method comprising:

reading data from a plurality of memory cells according to a first read voltage and a second read voltage having a higher level than the first read voltage;

reading assist data from the plurality of memory cells according to an assist read voltage having a level between the first read voltage and the second read voltage;

determining, based on the data and the assist data, a number of memory cells corresponding to a target read voltage selected from the first read voltage and the second read voltage; and determining, based on the number of memory cells and an expected number of memory cells, an adjustment value for the target read voltage.

11. The operating method of claim 10, wherein the number of memory cells is the number of memory cells having lower threshold voltages than the target read voltage among the plurality of memory cells when the target read voltage is the first read voltage.

12. The operating method of claim 11, further comprising:

when the target read voltage is the first read voltage, lowering the target read voltage by the adjustment value when the number of memory cells is greater than the expected number of memory cells; and raising the target read voltage by the adjustment value when the number of memory cells is less than the expected number of memory cells.

13. The operating method of claim 10, wherein the number of memory cells is the number of memory cells having higher threshold voltages than the target read voltage among the plurality of memory cells when the target read voltage is the second read voltage.

14. The operating method of claim 13, further comprising:

when the target read voltage is the second read voltage, raising the target read voltage by the adjustment value when the number of memory cells is greater than the expected number of memory cells; and lowering the target read voltage by the adjustment value when the number of memory cells is less than the expected number of memory cells.

15. The operating method of claim 10, wherein the determining of the adjustment value includes:

determining, based on an expected threshold voltage distribution, a first threshold voltage corresponding to a number of errors, which represents a difference between the number of memory cells and the expected number of memory cells;

determining, based on the expected threshold voltage distribution, a second threshold voltage corresponding to a predetermined adjustment number of errors; and determining, as the adjustment value, a difference between the first threshold voltage and the second threshold voltage.

16. The operating method of claim 15, wherein the adjustment number of errors is equal to or less than a number of errors that can be corrected through an error correcting operation.

17. The operating method of claim 10, wherein the target read voltage is one of the lowest read voltage and the highest read voltage among a plurality of read voltages.

18. An operating method of a controller, the operating method comprising consecutively performing first and second adjusting operations respectively on first and second regions commonly with reference data, wherein the first adjusting operation includes:

obtaining numbers of first and second target memory cells by reading first and second data and the reference data respectively according to first and second read voltages and a reference read voltage, the first and second target memory cells respectively corresponding to the first and second read voltages and the reference read voltage being between the first and second read voltages;

obtaining numbers of first and second deviant memory cells respectively based on the numbers of first and second target memory cells and predetermined first and second numbers respectively corresponding to the first and second read voltages;

obtaining first and second adjustment amounts based on the numbers of first and second deviant memory cells and an accumulated number of memory cells, the accumulated number being predetermined and depending on threshold voltages of the memory cells; and
adjusting the first and second read voltages respectively by the first and second adjustment amounts, and
wherein the second adjusting operations is performed in the same manner as the first adjusting operation except that the numbers of first and second target memory cells are obtained by the already-read reference data without repeatedly reading the reference data.

* * * * *